(12) United States Patent
Schmitt

(10) Patent No.: US 11,573,072 B2
(45) Date of Patent: Feb. 7, 2023

(54) MAGNETIC POSITION DETERMINATION SYSTEMS AND METHODS

(71) Applicant: Analog Devices International Unlimited Company, Limerick (IE)

(72) Inventor: Jochen Schmitt, Biedenkopf (DE)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/289,476

(22) Filed: Feb. 28, 2019

(65) Prior Publication Data

US 2020/0191546 A1 Jun. 18, 2020

Related U.S. Application Data

(60) Provisional application No. 62/779,323, filed on Dec. 13, 2018.

(51) Int. Cl.
*G01B 7/30* (2006.01)
*G01B 7/00* (2006.01)
(Continued)

(52) U.S. Cl.
CPC ............. *G01B 7/003* (2013.01); *G01B 7/30* (2013.01); *G01R 33/0094* (2013.01);
(Continued)

(58) Field of Classification Search
CPC ...... G01R 33/04; G01R 33/07; G01R 33/072; G01R 33/038; G01R 33/06;
(Continued)

(56) References Cited

U.S. PATENT DOCUMENTS 4,622,644 A * 11/1986 Hansen ................. G01B 7/003
324/251
5,585,719 A * 12/1996 Endo ....................... G01D 5/142
324/174

(Continued)

FOREIGN PATENT DOCUMENTS

CN 101065720 A 10/2007
CN 105593645 A 5/2016
(Continued)

OTHER PUBLICATIONS

[No Author Listed], 3D Magnetic Sensor for Angle Measurements TLE493D-W2B6, TLE493D-A2B6, TLI493D-A2B6 Application Note, Infineon Technologies AG, Aug. 21, 2018, 26 pages.
(Continued)

*Primary Examiner* — Vinh P Nguyen
(74) *Attorney, Agent, or Firm* — Wolf, Greenfield & Sacks, P.C.

(57) ABSTRACT

Systems and methods are provided for determining a position of a magnet. The systems and methods utilize a first sensor located at a first sensor position and arranged to measure at least two components of a magnetic field produced by the magnet, a second sensor located at a second sensor position and arranged to measure at least two components of the magnetic field produced by the magnet, and processing circuitry operatively connected to the first and second sensors to receive signals derived from signals outputted by the first and second sensors. A field angle is calculated from a first differential field of a first field dimension and a second differential field of a second field dimension orthogonal to the first field dimension. The first and second differential fields are calculated based on signals outputted by the first and second sensors.

20 Claims, 12 Drawing Sheets

(51) Int. Cl.
*G01R 33/00* (2006.01)
*G01R 33/04* (2006.01)
*G01R 33/07* (2006.01)
*G01R 33/09* (2006.01)

(52) U.S. Cl.
CPC ............ *G01R 33/04* (2013.01); *G01R 33/07* (2013.01); *G01R 33/09* (2013.01)

(58) Field of Classification Search
CPC .... G01R 33/0094; G01R 33/09; G01B 7/003; G01B 7/30; G01B 7/023; G01D 5/142; G01D 5/145; G01D 5/16; G01D 5/24476
See application file for complete search history.

(56) References Cited

U.S. PATENT DOCUMENTS

| | | | |
|---|---|---|---|
| 6,265,867 | B1 | 7/2001 | Fowler |
| 6,411,081 | B1 | 6/2002 | Spellman |
| 6,516,213 | B1 | 2/2003 | Nevo |
| 6,534,969 | B1 | 3/2003 | Dietmayer |
| 6,731,108 | B2 | 5/2004 | Zalunardo et al. |
| 6,757,557 | B1 | 6/2004 | Bladen et al. |
| 7,705,586 | B2 | 4/2010 | van Zon et al. |
| 7,772,835 | B2 | 8/2010 | Dmytriw et al. |
| 8,072,209 | B2 | 12/2011 | Jerance et al. |
| 8,321,173 | B2 | 11/2012 | Wallance et al. |
| 8,659,289 | B2 * | 2/2014 | Saruki .................... B82Y 25/00 324/252 |
| 8,803,513 | B2 | 8/2014 | Hosek et al. |
| 9,057,629 | B2 * | 6/2015 | Hohe .................... G01D 5/145 |
| 10,816,363 | B2 * | 10/2020 | Ruigrok ................ G01D 5/145 |
| 2013/0043863 | A1 | 2/2013 | Ausserlechner et al. |
| 2015/0028856 | A1 | 1/2015 | Putinier |
| 2015/0028858 | A1 | 1/2015 | Putinier |
| 2015/0042320 | A1 | 2/2015 | Cadugan et al. |
| 2015/0081246 | A1 | 3/2015 | Schaaf |
| 2015/0377648 | A1 | 12/2015 | Sirohiwala et al. |
| 2016/0178400 | A1 * | 6/2016 | Vuillermet ............. G01R 33/02 324/207.22 |
| 2016/0282141 | A1 | 9/2016 | Rajamani et al. |
| 2017/0030742 | A1 * | 2/2017 | Mochizuki ......... G01D 5/24476 |
| 2017/0089726 | A1 | 3/2017 | Scherr et al. |
| 2017/0160071 | A1 * | 6/2017 | May ...................... B60G 11/27 |
| 2018/0087888 | A1 | 3/2018 | Ausserlechner |
| 2018/0274896 | A1 | 9/2018 | Anagawa et al. |
| 2020/0064157 | A1 * | 2/2020 | Marauska ............... G01D 5/16 |

FOREIGN PATENT DOCUMENTS

| | | |
|---|---|---|
| CN | 108225381 A | 6/2018 |
| DE | 10 2016 218 530 A1 | 3/2018 |
| EP | 0997701 A3 | 10/2001 |
| EP | 1 321 743 A1 | 6/2003 |
| EP | 2 581 707 A1 | 4/2013 |
| EP | 3 270 112 A1 | 1/2018 |
| EP | 3 312 564 A1 | 4/2018 |
| EP | 3 588 011 A1 | 1/2020 |
| EP | 3 650 816 A1 | 5/2020 |
| JP | 2009-139252 A | 6/2009 |
| WO | WO 2006/035350 A1 | 4/2006 |
| WO | WO 2018/060149 A1 | 4/2018 |

OTHER PUBLICATIONS

Bratland et al., Linear Position Sensing Using Magnetoresistive Sensors. Honeywell Solid State Electronics Center, 2005, 6 pages.
Guyol, AMR Angle Sensors, Analog Devices, AN-1314 Application Note, 2014, 10 pages.
Extended European Search Report dated May 4, 2020 in connection with European Application No. 19213311.4.
European Communication dated Mar. 10, 2021 in connection with European Application No. 19213311.4.
European Communication dated Mar. 16, 2022 for European Application No. 19213311.4.
Chinese Office Action dated Apr. 14, 2021, in connection with Chinese Application No. 201911278499.1.

* cited by examiner

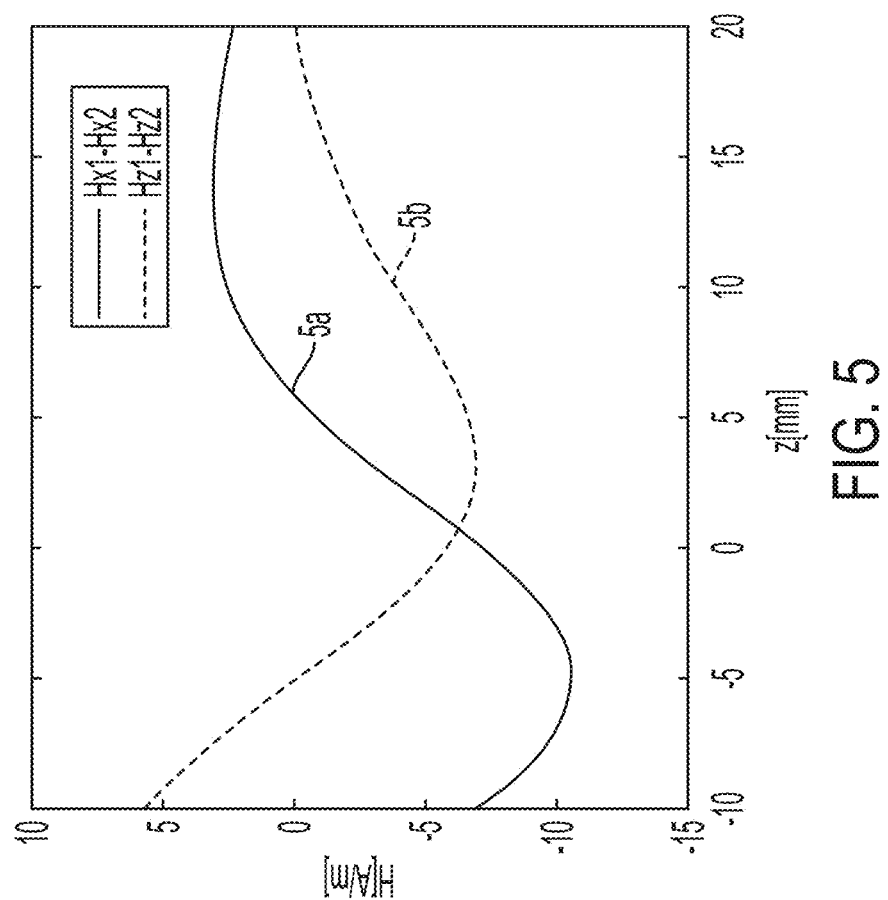

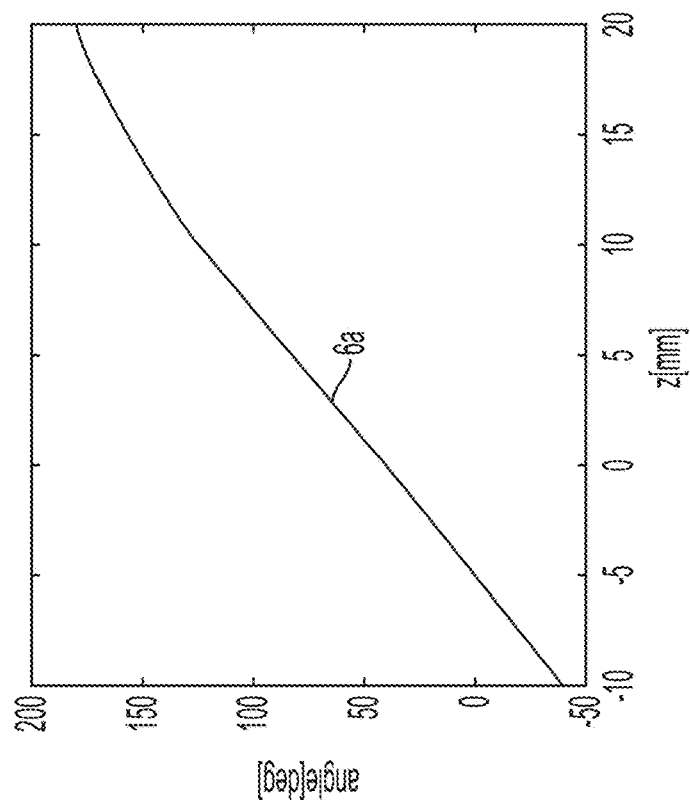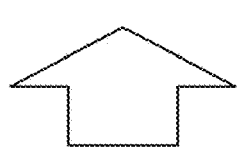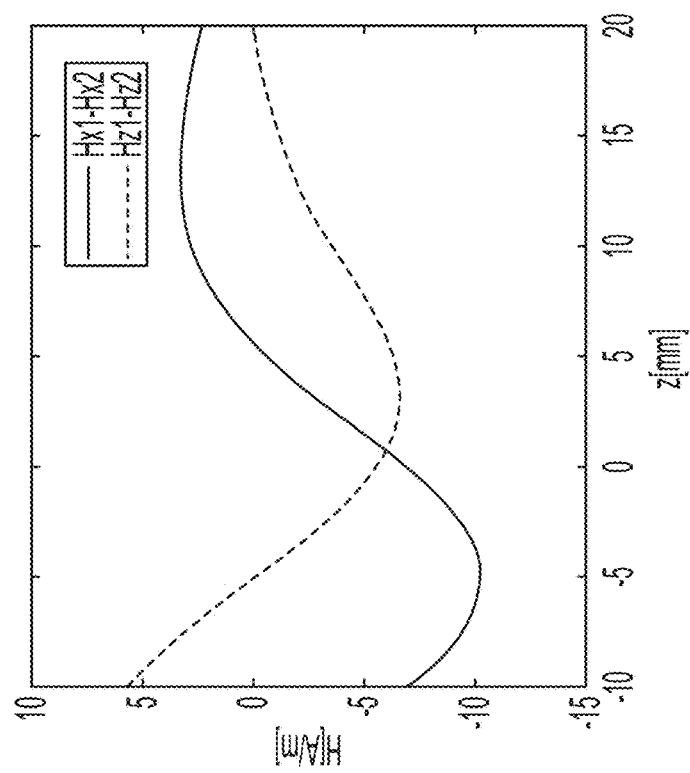
FIG. 6

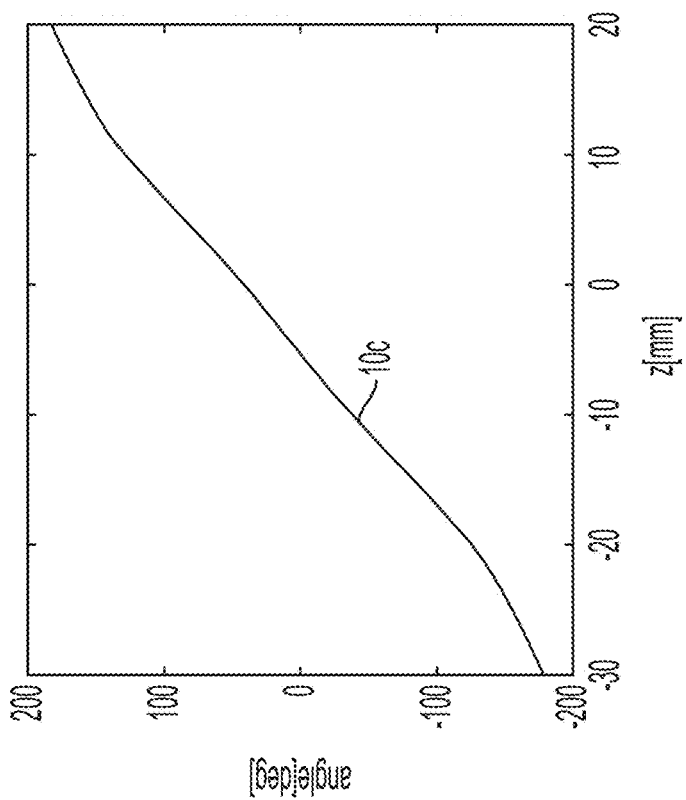
FIG. 10B
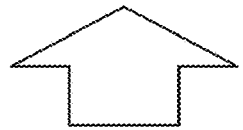
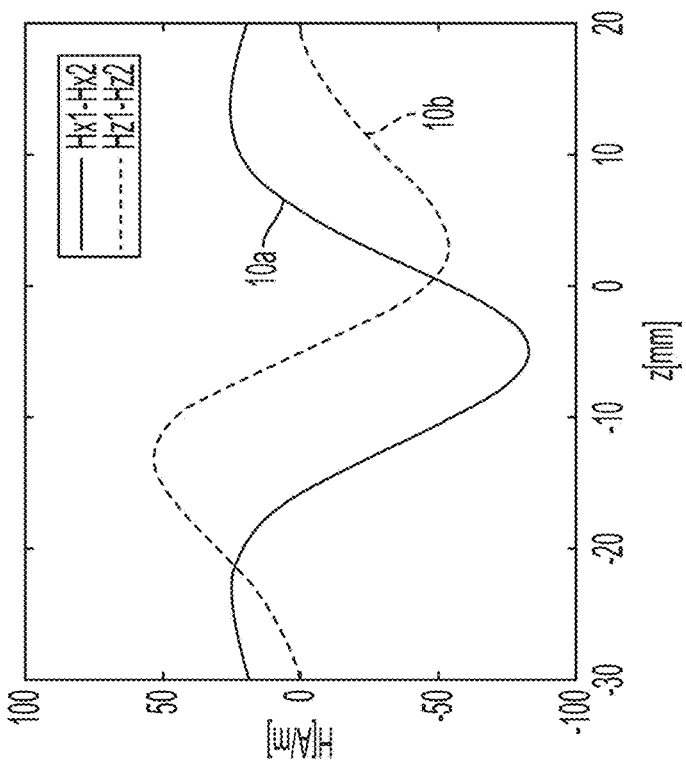
FIG. 10A

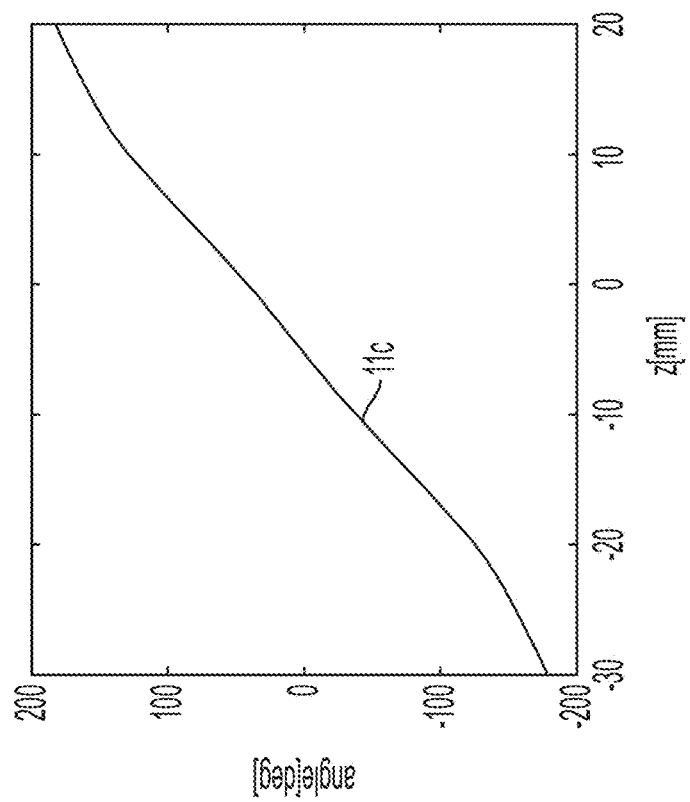
FIG. 11B
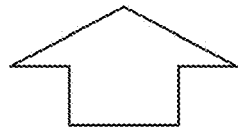
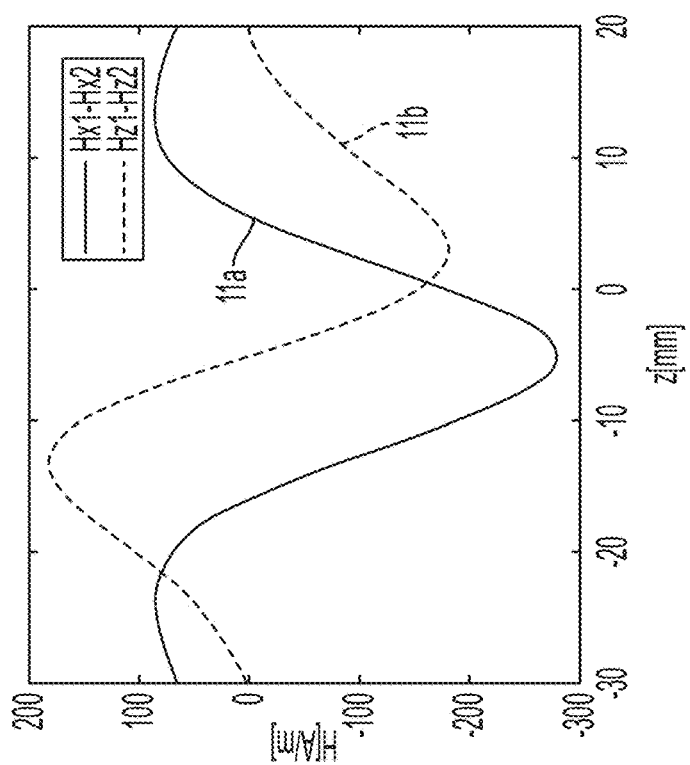
FIG. 11A

MAGNETIC POSITION DETERMINATION SYSTEMS AND METHODS

CROSS REFERENCE TO RELATED APPLICATIONS

The present application claims the benefit of U.S. Provisional Application No. 62/779,323, filed on Dec. 13, 2018, and entitled "MAGNETIC POSITION DETERMINATION SYSTEMS AND METHODS," the entire contents of which is incorporated by reference herein.

FIELD OF THE DISCLOSURE

The present application relates to magnetic systems and corresponding methods for determining a position of a movable object.

BACKGROUND

Some object position tracking systems use a magnet and a single magnetic sensor. The magnet is placed on a movable object. Moving the object changes the magnetic field sensed by the single magnetic field sensor. A determination of the object's position is made based on the sensed magnetic field.

SUMMARY OF THE DISCLOSURE

Systems and methods are provided for determining a position of a magnet. The systems and methods utilize a first sensor located at a first sensor position and arranged to measure at least two components of a magnetic field produced by the magnet, a second sensor located at a second sensor position and arranged to measure at least two components of the magnetic field produced by the magnet, and processing circuitry operatively connected to the first and second sensors to receive signals derived from signals outputted by the first and second sensors. A field angle is calculated from a first differential field of a first field dimension and a second differential field of a second field dimension orthogonal to the first field dimension. The first and second differential fields are calculated based on signals outputted by the first and second sensors.

In an embodiment, an object position determination system may include a movable object, a magnet configured to produce a magnetic field, and a plurality of magnetic field sensors configured to detect components of the magnetic field produced by the magnet in first and second directions at first and second locations. The magnet or the plurality of magnetic field sensors may be coupled to the movable object. The first direction may be orthogonal to the second direction. The plurality of magnetic field sensors may include: at the first location, a first sensor configured to detect a component of the magnetic field in the first direction and a second sensor configured to detect a component of the magnetic field in the second direction, and, at the second location, a third sensor configured to detect a component of the magnetic field in the first direction and a fourth sensor configured to detect a component of the magnetic field in the second direction.

In another embodiment, a system for determining a position of a magnet may include a first sensor located at a first sensor position and arranged to measure at least two components of a magnetic field produced by the magnet, a second sensor located at a second sensor position and arranged to measure at least two components of the magnetic field produced by the magnet, and processing circuitry operatively connected to the first and second sensors to receive signals derived from signals outputted by the first and second sensors. The processing circuitry may calculate a field angle from a first differential field in a first field dimension and a second differential field in a second field dimension orthogonal to the first field dimension, and may output a signal indicating a position of the magnet based on the calculated field angle. The first and second differential fields may be obtained based on the signals outputted by the first and second sensors.

In a further embodiment, a method for determining a position of a magnet may include providing a sensor system that may include first and second sensors arranged to measure at least two components of the magnet's magnetic field at first and second sensor positions, respectively; and using a microprocessor operatively connected to the first and second sensors to: receive signals derived from signals outputted by the first and second sensors, calculate a field angle from a first differential field in a first field dimension and a second differential field in a second field dimension orthogonal to the first dimension, and output a position of the magnet based on the field angle calculated from the first and second differential fields. The first and second differential fields may be obtained based on the received signals.

BRIEF DESCRIPTION OF DRAWINGS

Various aspects of the technology and embodiments of the application will be described with reference to the following figures. It should be appreciated that the figures are not necessarily drawn to scale. Items appearing in multiple figures are indicated by the same reference numeral in all the figures in which they appear.

FIG. 5 shows data obtained from differential field calculations of measurement data from an arrangement of the type shown in FIG. 4A.

FIG. 6 shows field angle data (right side) obtained from differential field data (left side).

FIG. 10A shows differential field data, and FIG. 10B shows field angle data obtained from the differential field data of FIG. 10A.

FIG. 11A shows differential field data, and FIG. 11B shows field angle data obtained from the differential field data of FIG. 11A.

DETAILED DESCRIPTION

Figure 1:
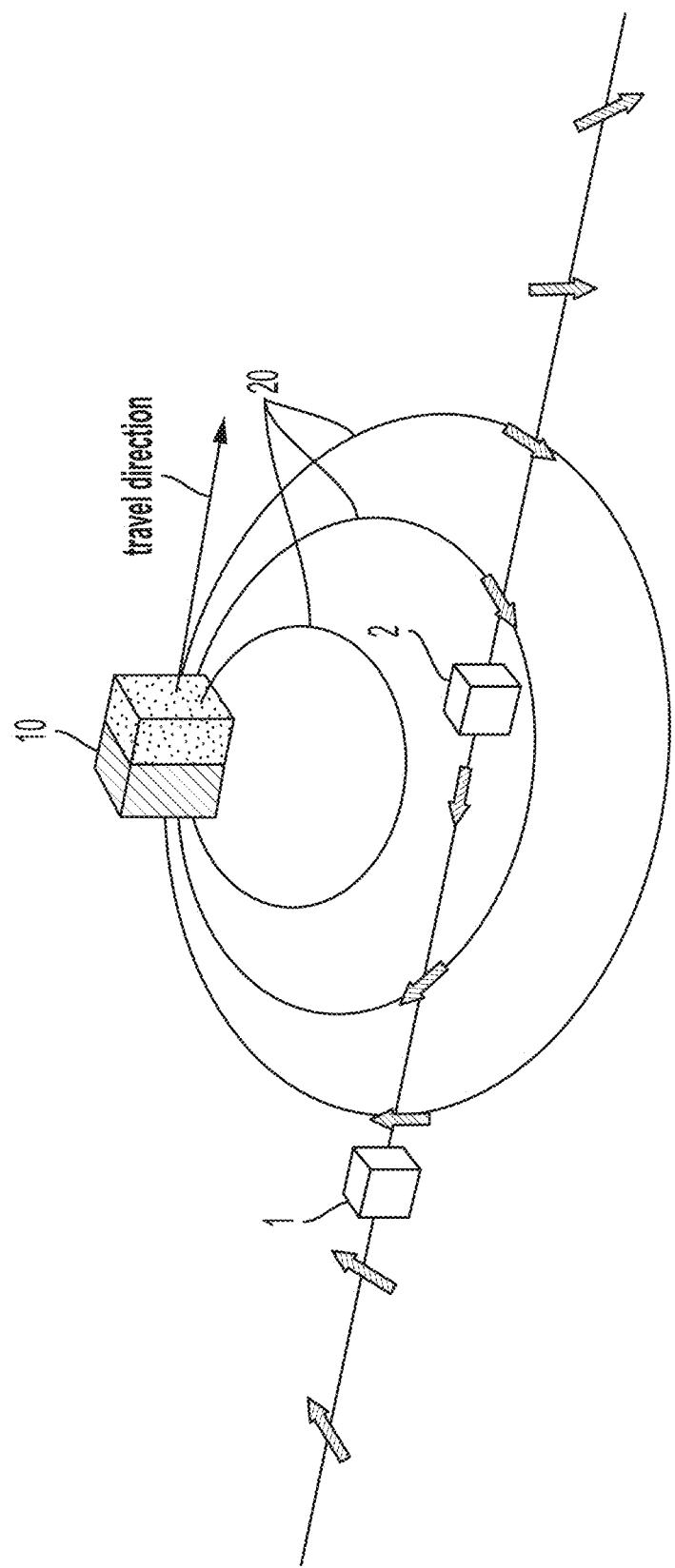
FIG. 1 schematically shows an environment of an embodiment of the present technology.

In a device where there is a movable part or object, it may be desirable to be able determine whether the object is moving properly and predictably along a known path. This determination can be useful to diagnose a potential malfunction of the device, among other possible uses. However, it can be difficult if not impossible to view the object while it moves, because the object may be hidden from view and/or may be too small to be visualized easily.

For example, for machinery such as brakes of an automobile, it may be desirable to be able to determine whether components of the brakes are moving properly and predictably. However, visualizing small brake components in motion can be difficult if not impossible. In another example, for a syringe used to inject a fluid to an internal region of an animal, it may be desirable to be able to determine whether a plunger used for injection of the fluid has traveled its full path so that all of the fluid is injected. However, it can be difficult if not impossible to view the plunger to know the plunger's position during injection.

Magnets can be used to track an object's location or position. A useful feature of magnets is that they can provide homing signals without requiring a power source and also without requiring transmission wires or even a transmitter. More specifically, a magnet can provide a homing signal in the form of a magnetic field. The magnetic field has directional characteristics resulting from the presence of north and south poles of the magnet. The magnetic field also has an intensity or strength that varies as a function of distance from the magnet's center. That is, the strength of a magnet's magnetic field decreases as the distance from the magnet's center increases.

The properties of a magnet's magnetic field may be exploited to determine a location or position of the magnet. These properties may also be exploited to track a position of a movable object. By attaching a magnet to the object and measuring the magnetic field of the magnet, the object's position can be determined even if the object cannot be seen.

To be useful for tracking a small movable object, a magnet should be, in at least some embodiments, sized so that it would not impede or alter the small object's normal movement. One consideration in using a small magnet is that its magnetic field would be small and hard to discern from environmental magnetic fields, commonly referred to as stray fields. For example, stray fields produced by common electrical equipment (e.g., lights, phones, computers, televisions) can have a magnitude similar to a magnitude of the magnetic field of the small magnet, and therefore can mask the small magnet's magnetic field.

Some aspects of the present technology provide systems and methods that enable a small magnetic field, such as that produced by a small-sized magnet, to be sensed and measured precisely and reproducibly even in the presence of a stray field, thus enabling a position or location of the magnet to be determined precisely and reproducibly. The magnetic system may thus be used to determine the position of an object, such as a movable object to which the magnet may be attached.

Embodiment 1

According to an embodiment of the present technology, an object position determination system may be comprised of a movable object, a magnet configured to produce a magnetic field, and a plurality of magnetic field sensors configured to detect the magnetic field produced by the magnet along first and second directions at first and second locations. The magnet or the plurality of magnetic field sensors may be coupled to the movable object. The first and second directions may be orthogonal to each other (e.g., x and z; or x and y; or y and z). The plurality of magnetic field sensors may include: at the first location, a first sensor that detects the magnetic field along the first direction and a second sensor that detects the magnetic field along the second direction; and, at the second location, a third sensor that detects the magnetic field along the first direction and a fourth sensor that detects the magnetic field along the second direction.

In an aspect of the embodiment, the magnet may be coupled to the movable object, and the plurality of magnetic field sensors may be fixed in place.

In an aspect of the embodiment, some or all of the plurality of magnetic field sensors may be magnetoresistive sensors. For example, the first and second sensors may be magnetoresistive sensors, or the first and third sensors may be magnetoresistive sensors.

In an aspect of the embodiment, the system may be further comprised of processing circuitry coupled to the plurality of magnetic field sensors. The processing circuitry may be configured to determine differential magnetic field values in the first and second directions based on output signals from the plurality of magnetic field sensors.

In an aspect of the embodiment, the first sensor, the second sensor, the third sensor, and the fourth sensor may be co-linear along an axis extending in the first direction or the second direction.

In an aspect of the embodiment, at the first location, the first sensor and the second sensor may be co-linear along a first axis extending in a third direction orthogonal to the first direction and orthogonal to the second direction, and, at the second location, the third sensor and the fourth sensor may be co-linear along a second axis parallel to the first axis.

Embodiment 2

According to an embodiment of the present technology, a system for determining a position of a magnet may be comprised of first and second sensor systems and a microprocessor. The first sensor system may be located at a first position and may be arranged to measure at least two components of a magnetic field produced by a magnet. The second sensor system may be located at a second position different from the first position, and may be arranged to measure at least two components of the magnetic field produced by the magnet. That is, the first sensor system may measure two components of the magnetic field at the first position, and the second sensor system may measure two components of the magnetic field at the second position different from the first sensor position.

The microprocessor may be operatively connected to the first and second sensor systems to receive signals derived from signals outputted by the first and second sensor systems. The microprocessor may be programmed to calculate a field angle from a first differential field in a first dimension and a second differential field in a second dimension orthogonal to the first dimension, and to output a position of the magnet based on the field angle calculated from the first and second differential fields. The first and second differential fields may be obtained based on the signals outputted by the first and second sensor systems.

In an aspect of the embodiment, each of the first and second sensor systems may include a first sensing element arranged to sense a component of the magnetic field in the first dimension, and a second sensing element arranged to sense a component of the magnetic field in the second dimension. The microprocessor may be programmed to perform a differential-field routine to:
receive a first signal derived from an output of the first sensing element of the first sensor system, the first signal indicating a value of the magnetic field in the first dimension at the first position;
receive a second signal derived from an output of the first sensing element of the second sensor system, the second signal indicating a value of the magnetic field in the first dimension at the second position,
receive a third signal derived from an output of the second sensing element of the first sensor system, the third signal indicating a value of the magnetic field in the second dimension at the first position; and
receive a fourth signal derived from an output of the second sensing element of the second sensor system, the fourth signal indicating a value of the magnetic field in the second dimension at the second position.

In an aspect of the embodiment, the microprocessor may be programmed to perform the differential-field routine to:
calculate the first differential field of the first dimension by calculating a difference between the first signal and the second signal;
calculate the second differential field of the second dimension by calculating a difference between the third signal and the fourth signal; and
calculate the field angle by calculating an arctan of the first differential field and the second differential field.

In an aspect of the embodiment, each of the first and second sensor systems may be comprised of a magnetoresistive sensor system, or a Hall-effect sensor system, or a fluxgate sensor system. For example, the magnetoresistive sensor system may be comprised of at least one anisotropic magnetoresistive (AMR) sensor, or at least one giant magnetoresistive (GMR) sensor, or at least one tunnel magnetoresistive (TMR) sensor, or a combination of these sensors.

In various aspects of the embodiment, the position of the magnet may be along a predetermined travel path of the magnet. For example, the predetermined travel path of the magnet may be a linear travel path or a non-linear travel path, or may be a path that has one or more linear portions and one or more non-linear portions.

In an aspect of the embodiment, the first sensor system and the second sensor system may be coplanar. For example, the first and second sensing elements of the first sensing system and the first and second sensing elements of the second sensing system may be disposed on a common plane. The first and second sensing elements of the first sensor system may be located on a single die at the first location, or may be located on separate dies at the first location. Similarly, the first and second sensing elements of the second sensor system may be located on a single die at the second location, or may be located on separate dies at the second location.

In an aspect of the embodiment, the first and second sensing elements of the first sensor system may have a stacked arrangement, and the first and second sensing elements of the second sensor system may have a stacked arrangement, such that the two stacked arrangements may be disposed on a common plane. For example, the first sensing element of the first sensor system and the first sensing element of the second sensor system may be coplanar on a first plane, and the second sensing element of the first sensor system and the second sensing element of the second sensor system may be coplanar on a second plane. For each of the stacked arrangements, the first and second sensing elements may be stacked adjacent each other or may be stacked such that a printed circuit board or other structure is interposed.

In an aspect of the embodiment, the first and second sensor systems may be coplanar with the predetermined travel path of the magnet.

In an aspect of the embodiment, the predetermined travel path of the magnet may be aligned with a north-to-south direction of poles of the magnet.

In an aspect of the embodiment, the predetermined travel path of the magnet may be coplanar with a north-to-south direction of poles of the magnet.

In an aspect of the embodiment, the predetermined travel path of the magnet may be arranged not to be aligned orthogonal to a north-to-south direction of poles of the magnet.

In an aspect of the embodiment, at least one of the first and second sensor systems has a Wheatstone bridge configuration.

In an aspect of the embodiment, the magnet is attached to a movable structure, and the first and second sensor systems are at fixed positions.

In various aspects of the embodiment, the magnetic field measured by the first and second sensor systems may be:
in a range of about −10 A/m to about +10 A/m; or
in a range of about −100 A/m to about +100 A/m; or
in a range of about −1 kA/m to about +1 kA/m; or
in a range of about −10 kA/m to about +10 kA/m.

Embodiment 3

According to an embodiment of the present technology, a system for determining a position of a magnet is comprised of first and second sensors and a microprocessor. The first sensor may be located at a first position and may be arranged to measure a magnetic field produced by a magnet at the first position. The second sensor may be located at a second position and may be arranged to measure the magnetic field produced by the magnet at the second position, which is different from the first position. The microprocessor may be operatively connected to the first and second sensors to receive signals derived from signals outputted by the first and second sensors. Each of the first and second sensors may be comprised of: a first sensing element arranged to sense a component of the magnetic field in a first direction, and a second sensing element arranged to sense a component of the magnetic field in a second direction orthogonal to the first direction The microprocessor may be programmed to perform a differential-field routine to:
receive a first signal derived from a signal outputted by the first sensor, in which the first signal may indicate a value of the magnetic field in the first direction at the first position,
receive a second signal derived from a signal outputted by the second sensor, in which the second signal may indicate a value of the magnetic field in the first direction at the second position,
receive a third signal derived from a signal outputted by the first sensor, in which the third signal may indicate a value of the magnetic field in the second direction at the first position,
receive a fourth signal derived from a signal outputted by the second sensor, in which the fourth signal may indicate a value of the magnetic field in the second direction at the second position, determine a first-direction differential by calculating a difference between the first signal and the second signal, determine a second-direction differential by calculating a difference between the third signal and the fourth signal, correlate the first-direction differential and the second-direction differential to a single value representing the position of the magnet, and output a signal indicating the position of the magnet.

In an aspect of the embodiment, the differential-field routine may be performed by the microprocessor to correlate the first-direction differential and the second-direction differential to the single value representing the position of the magnet by determining a quotient of the first-direction differential and the second-direction differential, and determining an arctan value of the quotient.

Embodiment 4

According to an embodiment of the present technology, a method for determining a position of a magnet may be comprised of obtaining:

a first signal derived from a signal outputted by a first sensor, in which the first signal may indicate a value of a magnetic field in the first direction at a first sensor position, a second signal derived from a signal outputted by a second sensor, in which the second signal may indicate a value of the magnetic field in the first direction at a second sensor position, a third signal derived from a signal outputted by the first sensor, in which the third signal may indicate a value of the magnetic field in the second direction at the first sensor position, and a fourth signal derived from a signal outputted by the second sensor, in which the fourth signal may indicate a value of the magnetic field in the second direction at the second sensor position.

The method may further be comprised of: determining a first-direction differential by calculating a difference between the first signal and the second signal; determining a second-direction differential by calculating a difference between the third signal and the fourth signal; and correlating the first-direction differential and the second-direction differential to a single value representing a position of a magnet that produced the magnetic field.

In an aspect of the embodiment, the correlating may include determining a quotient of the first-direction differential and the second-direction differential, and determining an arctan value of the quotient.

Embodiment 5

According to an embodiment of the present technology, a method for determining a position of a magnet may be comprised of providing a sensor system that may include a first sensor arranged to measure a magnetic field produced by a magnet at a first position, and a second sensor arranged to measure the magnetic field produced by the magnet at a second position different from the first sensor position. The method may be further comprised of using a microprocessor operatively connected to the first and second sensors to:

receive signals derived from signals outputted by the first and second sensors, calculate a field angle from a first differential field in a first dimension and a second differential field in a second dimension orthogonal to the first dimension, the first and second differential fields being obtained based on the received signals, and output a position of the magnet based on the field angle calculated from the first and second differential fields.

In an aspect of the embodiment, the received signals may include:

a first signal indicating a value of the magnetic field in the first dimension at the first sensor position, a second signal indicating a value of the magnetic field in the first dimension at the second sensor position, a third signal indicating a value of the magnetic field in the second dimension at the first sensor position, and a fourth signal indicating a value of the magnetic field in the second dimension at the second sensor position.

The microprocessor may be programmed to:

calculate the first differential field in the first dimension by calculating a difference between the first signal and the second signal, calculate the second differential field in the second dimension by calculating a difference between the third signal and the fourth signal, and calculate the field angle by calculating an arctan of the first differential field and the second differential field.

Embodiment 6

According to an embodiment of the present technology, a method for determining a position of a magnet may be comprised of: providing a sensor system that includes a first sensor located at a first sensor position and arranged to measure at least two components of a magnetic field produced by a magnet, and a second sensor located at a second sensor position different from the first sensor position and arranged to measure at least two components of the magnetic field produced by the magnet. The method also may be comprised of using a microprocessor operatively connected to the first and second sensors to: receive signals derived from signals outputted by the first and second sensors, calculate a field angle from a first differential field in a first field dimension and a second differential field in a second field dimension orthogonal to the first dimension, the first and second differential fields being obtained based on the signals outputted by the first and second sensors, and output a position of the magnet based on the field angle calculated from the first and second differential fields.

In an aspect of the embodiment, the received signals may include: a first signal indicating a value of the magnetic field in the first dimension at the first sensor position, a second signal indicating a value of the magnetic field in the first dimension at the second sensor position, a third signal indicating a value of the magnetic field in the second dimension at the first sensor position, and a fourth signal indicating a value of the magnetic field in the second dimension at the second sensor position. The using of the microprocessor may include using the microprocessor to: calculate the first differential field in the first dimension by calculating a difference between the first signal and the second signal, calculate the second differential field in the second dimension by calculating a difference between the third signal and the fourth signal, and calculate the field angle by calculating an arctan of the first differential field and the second differential field.

The foregoing features may be used, separately or together in any combination, in any of the embodiments discussed herein.

Turning now to the figures, an example of an object position detection system according to various aspects of the present technology is shown in FIG. 1 As discussed above, the system is configured to determine the position of an object and may include a magnet and at least two magnetic field sensors. The magnetic field sensors may be arranged to measure, at two different locations, a magnetic field produced by the magnet. The magnetic field may be sensed in two directions at each of the two different locations, which may enable generation of differential measurements representing the difference in the magnetic field sensed at the two locations in a given direction. The magnet or the magnetic field sensors may be attached to a movable object, and the relative motion between the magnet and the magnetic field sensors may produce changes in the magnetic field sensed by the magnetic field sensors, such that position and motion may be detected.

In FIG. 1, a magnet 10 is shown relative to a first sensor 1 and a second sensor 2, according to various embodiments of the present technology. Each of the first sensor 1 and second sensor 2 may be a magnetic field sensor configured to sense the magnetic field generated by the magnet 10. For example, each of the first sensor 1 and the second sensor 2 may be a two-dimensional ("2D") anisotropic magnetoresistive ("AMR") sensor, which is structured to measure a magnetic field from the magnet 10, represented schematically by curved field lines 20 in FIG. 1, in two different dimensions (e.g., x-y or y-z or x-z). The first sensor 1 may be spaced apart from the second sensor 2 by a distance d, so that the magnetic field at a first position corresponding to the first sensor 1 may be measured in two dimensions, and the magnetic field at a second position corresponding to the second sensor 2 may be measured in two dimensions. The distance d may have a value between 0.5 cm and 5 cm, or d may have any value that would be suitable for each of the first and second sensors 1, 2 to sense the magnetic field generated by the magnet 10.

Other magnetic sensors known in the art may be used instead of 2D-AMR sensors, provided that the other magnetic sensors are structured to measure a magnetic field in at least two different dimensions. For example, Hall-effect sensors, fluxgate sensors, and other magnetoresistive sensors ("MR"), such as giant magnetoresistive (GMR) sensors and tunnel magnetoresistive (TMR) sensors, may be used instead of AMR sensors, as long as the sensors are structured to measure a magnetic field in at least two different dimensions. Also, while the non-limiting embodiment shown FIG. 1 illustrates two magnetic field sensors, various alternative embodiments may include more than two magnetic field sensors configured to detect magnetic fields along two different axes at two different locations. For example, according to an alternative embodiment, four magnetic field sensors may be implemented, with two positioned at a first location and two positioned at a second location. Each of the four magnetic field sensors may be configured to detect the magnetic field in a single dimension, respectively, such that the combination of the four magnetic field sensors may provide magnetic field measurements in two dimensions at the first and second locations.

Although not shown in FIG. 1, the first and second sensors 1, 2 may be operatively connected to circuitry configured to process the output signals of the sensors 1, 2. In some embodiments, the first and second sensors 1, 2 may be operatively connected to a programmed microprocessor, as discussed in more detail below.

Figure 2A:
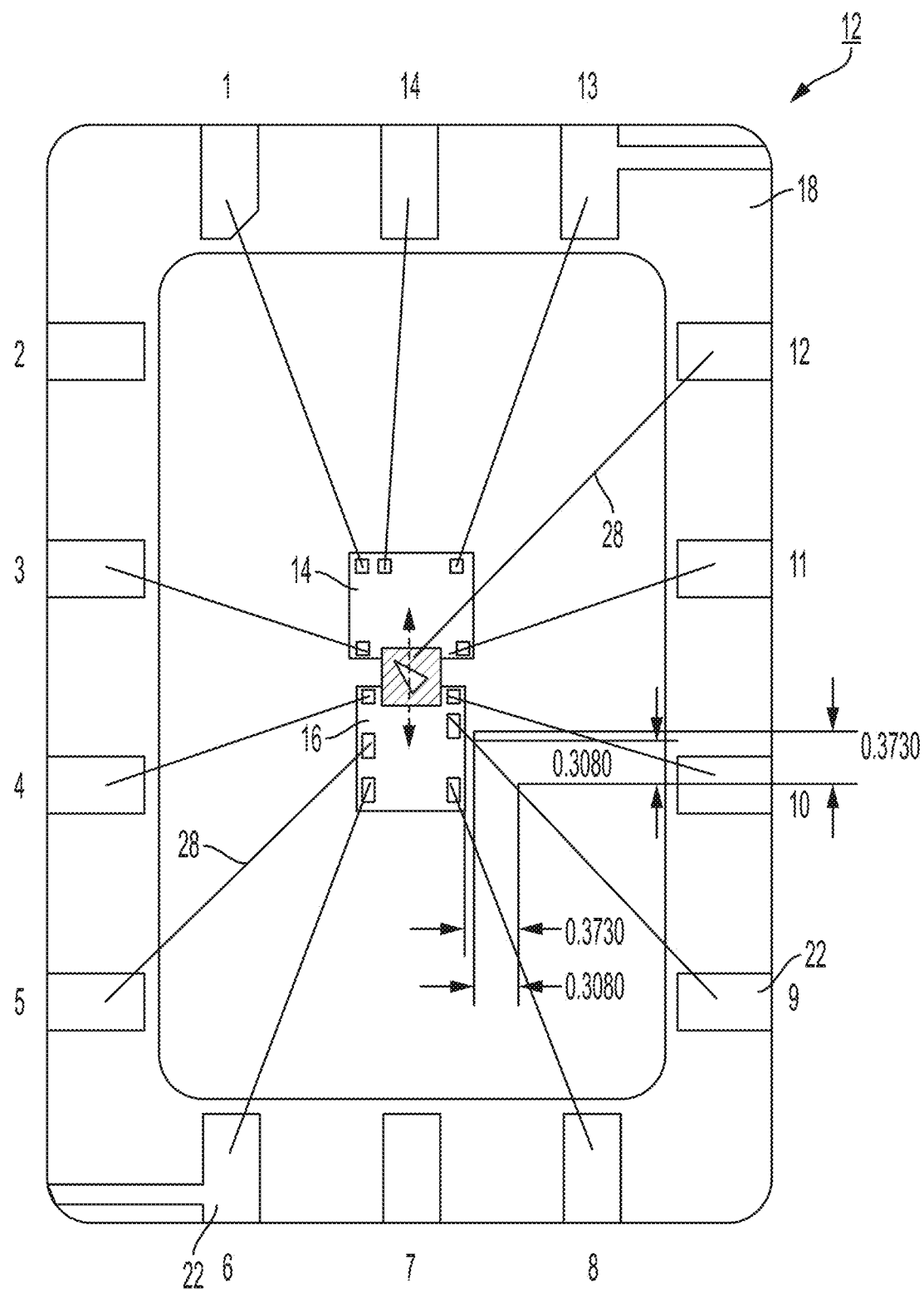
FIG. 2A schematically shows circuitry of a sensor according to an embodiment of the present technology.

In variously embodiments of the present technology, the first sensor 1 may be structured to include circuitry 12 such as shown in FIG. 2A. The circuitry 12 may include a first pair comprised of a first sensor element 14 and a second sensor element 16 attached to a circuit board 18 of a chip package. Electrical wiring 28 may be used to connect the first and second sensor elements 14, 16 to contact pads 22 that, in turn, may be electrically connected to processing circuitry (e.g., a microprocessor) (not shown) to provide signals to the processing circuitry. The second sensor 2 may be structured to include circuitry similar to the circuitry 12 shown in FIG. 2A.

In some embodiments of the present technology, the first and second sensor elements 14, 16 may have the same internal structure but may be oriented such that one is rotated by 90° relative to the other, as shown in FIG. 2A, to measure the magnetic field in two different orthogonal dimensions. For example, one of the first and second sensor elements 14, 16 may measure the x-direction component ("x-component" herein) of the magnetic field, and the other of the first and second sensor elements 14, 16 may measure the z-direction component ("z-component" herein) of the magnetic field. The first and second sensor elements 14, 16 may be formed on a single die or on separate dies.

FIG. 2A shows the first and second sensor elements 14, 16 to be coplanar. That is, the first and second sensor elements 14, 16 are shown to be positioned on one planar surface of the circuit board 18. In some embodiments, the center-to-center distance of the first and second sensor elements 14, 16 may be in a range of approximately 0.9 mm to 1.1 mm, and the separation distance between nearest edges of the first and second sensor elements 14, 16 may be in a range of approximately 0.05 mm to 0.25 mm. In various embodiments, the first and second sensor elements 14, 16 of the first and second sensors 1, 2 may be coplanar, i.e., all four sensor elements may share a common plane. In various other embodiments, the first and second sensor elements 14, 16 of the first sensor 1 may be coplanar on a first plane, and the first and second sensor elements 14, 16 of the second sensor 2 may be coplanar on a second plane different from the first plane.

Figure 2B:
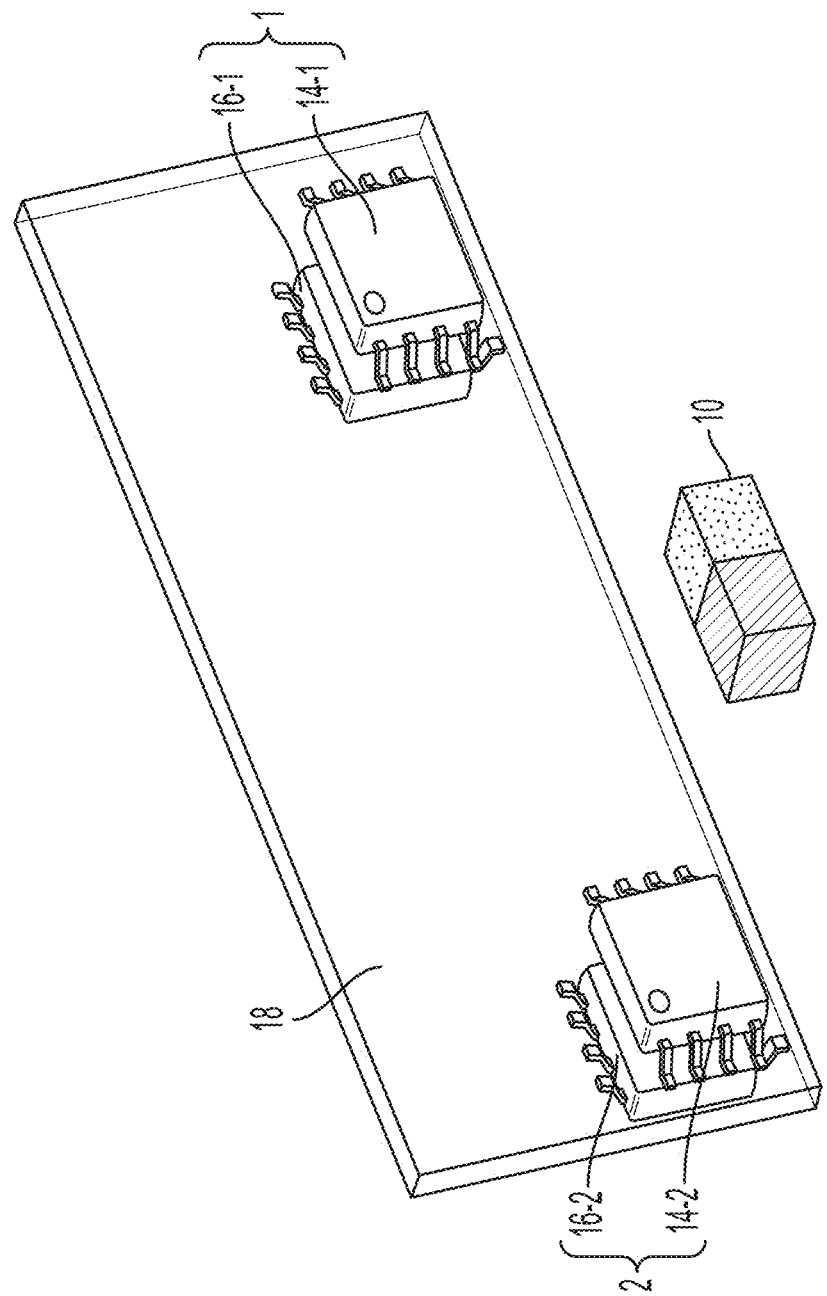
FIG. 2B schematically shows an arrangement of pairs of sensor elements according to an embodiment of the present technology.

In various alternative embodiments, the first and second sensor elements 1, 2, may not be coplanar but instead may have a stacked arrangement, as schematically shown in FIG. 2B. In the stacked arrangement, the first sensor 1 may have first and second sensor elements 14-1 and 16-1 that may be stacked or overlaid in a first stacking direction perpendicular to a main surface of the circuit board 18 supporting the first and second sensor elements 14-1, 16-1. Similarly, the second sensor 2 may have first and second sensor elements 14-2 and 16-2 that may be stacked or overlaid in a second stacking direction perpendicular to the main surface of the circuit board 18 supporting the first and second sensor elements 14-2, 16-2. The first and second stacking directions may be parallel to each other.

The first and second sensor elements 14-1, 16-1 of the first sensor 1 may be rotated by 90° relative to each other, to measure the magnetic field in two different orthogonal directions. Similarly, the first and second sensor elements 14-2, 16-2 of the second sensor 2 may be rotated by 90° relative to each other, to measure the magnetic field in two different orthogonal directions at a location different from the first sensor 1, as depicted in FIG. 2B.

FIG. 2B shows the first sensor elements 14-1, 14-2 to be located on opposite sides of the circuit board 18 relative to the second sensor elements 16-1, 16-2, according to some embodiments of the present technology. That is, the first sensor element 14-1 and the second sensor element 16-1 of the first sensor 1 may be stacked or overlaid on opposite sides of the circuit board 18, and, similarly, the first sensor element 14-2 and the second sensor element 16-2 of the second sensor 2 may be stacked or overlaid on opposite sides of the circuit board 18. In this regard, the circuit board 18 is shown to be transparent in FIG. 2B in order to illustrate the relative positions of the sensor elements 14-1, 14-2, 16-1, 16-2, according to some embodiments of the present technology, but need not be transparent. Alternatively, in some other embodiments of the present technology, the first sensor element 14-1 and the second sensor element 16-1 may be stacked or overlaid on one side of the circuit board 18, and, similarly, the first sensor element 14-2 and the second sensor element 16-2 may be stacked or overlaid on one side of the circuit board 18.

Figure 3B:
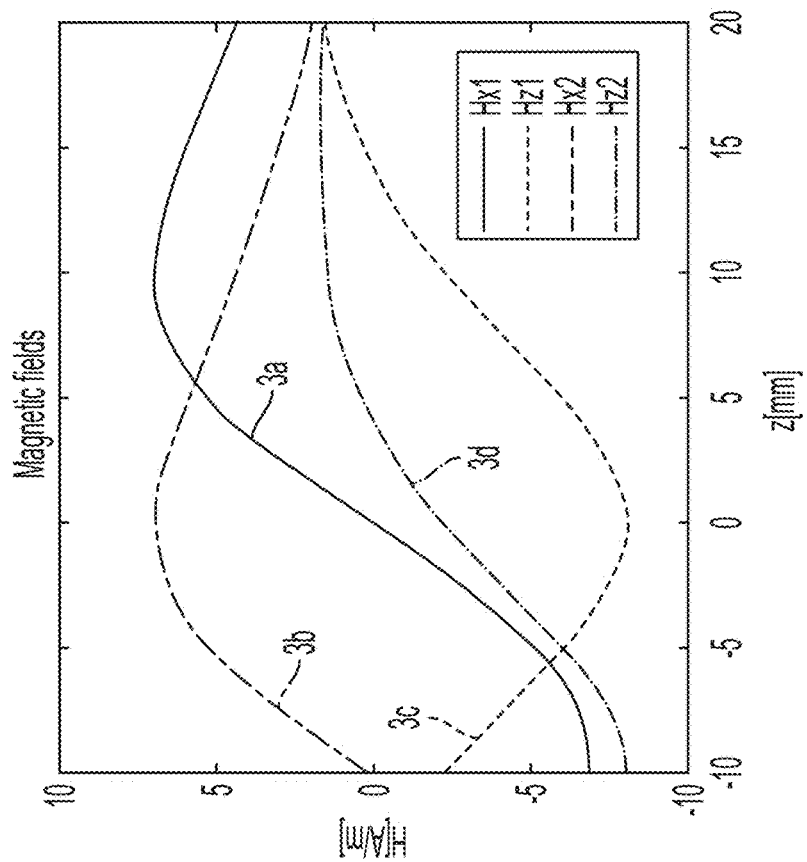
FIG. 3B shows measurement data from an arrangement of the type shown in FIG. 3A.
Figure 3A:
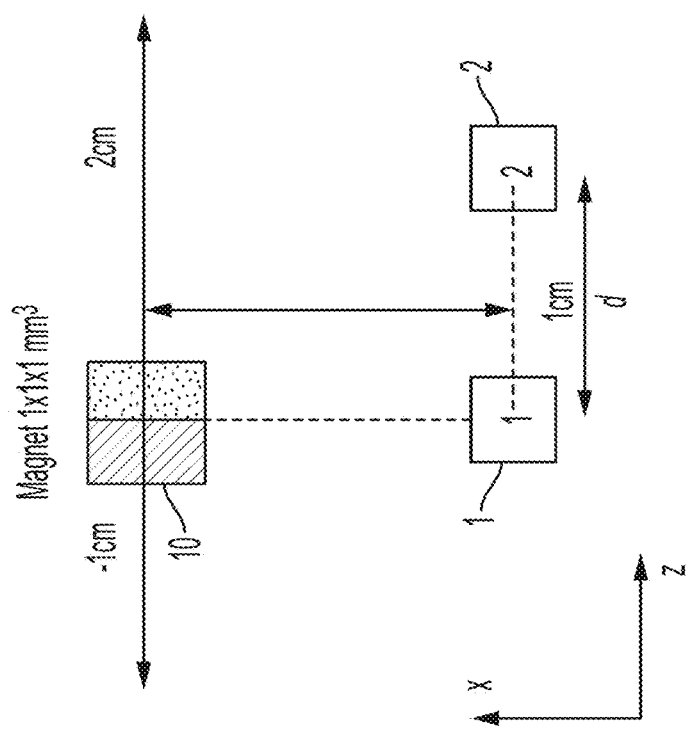
FIG. 3A schematically shows an arrangement for measuring a magnet's magnetic field according to an embodiment of the present technology.

In an embodiment of the present technology, schematically shown in FIG. 3A, the first and second sensors 1, 2, may be separated by a distance d of 1 cm, and each of the first and second sensors 1, 2 may be structured to measure an x-component and a z-component of the magnetic field produced by the magnet 10, which is movable in the z-direction. The magnet 10 may have a size of 1 mm$^3$ in this non-limiting embodiment, but other sizes are possible.

FIG. 3B shows measurements taken by a pair of sensors in an arrangement of the type shown in FIG. 3A. The magnet 10 was moved in the z-direction over a distance of 3 cm, from −1 cm to 2 cm, with the "0" position corresponding to a perpendicular alignment of the magnet 10 with the first sensor 1. Curves 3a, 3b represent the x-component of the magnetic field measured by the first sensor 1 and the second sensor 2, respectively, as a function of distance in the z-direction. Curves 3c, 3d represent the z-component of the magnetic field measured by the first sensor 1 and the second sensor 2, respectively, as a function of distance in the z-direction.

Figure 4B:
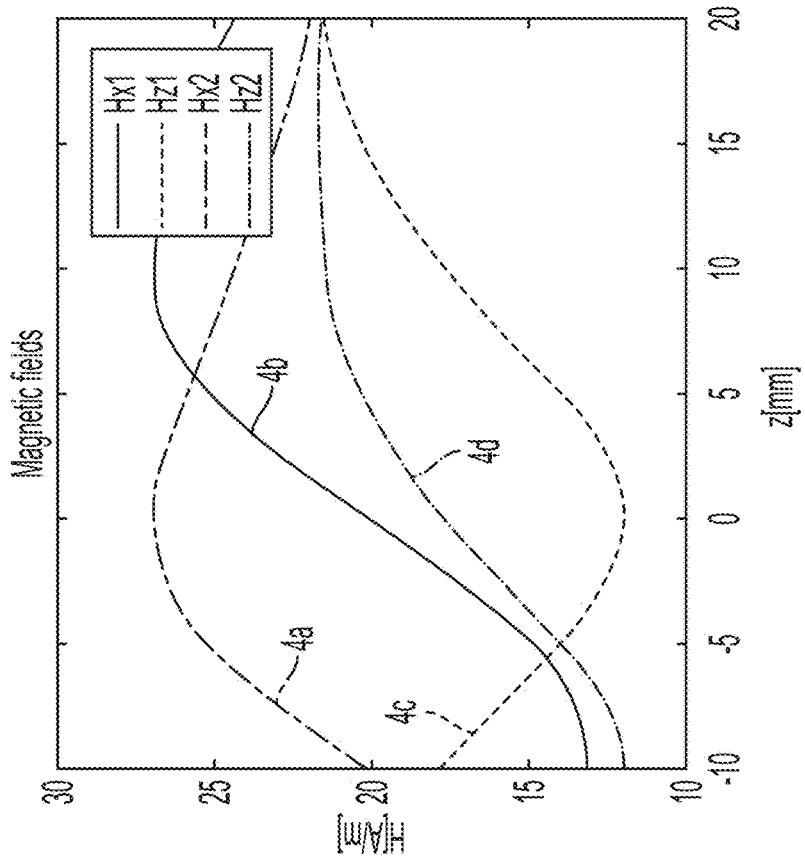
FIG. 4B shows measurement data from an arrangement of the type shown in FIG. 4A.
Figure 4A:
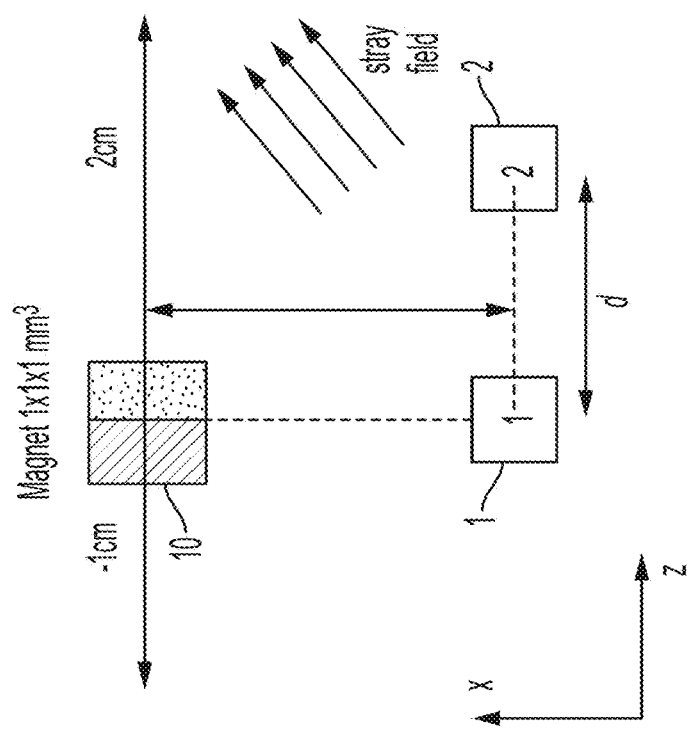
FIG. 4A schematically shows the arrangement of FIG. 3A in the presence of a stray field.

FIG. 4A schematically shows the arrangement of FIG. 3A in the presence of a stray field that is a uniform magnetic field, represented by parallel arrows. FIG. 4B shows the corresponding measurements taken by the first and second sensors 1, 2 in the presence of the stray field, in an arrangement of the type shown in FIG. 4A. Curves 4a, 4b represent the x-component of the magnetic field measured by the first sensor 1 and the second sensor 2, respectively, as a function of distance in the z-direction. Curves 4c, 4d represent the z-component of the magnetic field measured by the first sensor 1 and the second sensor 2, respectively, as a function of distance in the z-direction.

A comparison of FIGS. 3B and 4B reveals that the presence of the stray field does not alter the shapes of the x-component curves 3a, 4a measured by the first sensor 1; does not alter the shapes of the x-component curves 3b, 4c measured by the second sensor 2; does not alter the shapes of the z-component curves 3c, 4c measured by the first sensor 1; and does not alter the shapes of the z-component curves 3d, 4d measured by the second sensor 2. Instead, all of the curves in FIG. 4B show a uniform upward shift to higher magnetic field values, relative to the curves in FIG. 3B, with the shift corresponding to the stray field's strength.

According to some embodiments of the present technology, the effects of the stray field on the magnetic field measurements taken by the first and second sensors 1, 2 may be eliminated by using differential field calculations. More specifically, a calculation of the difference between the curve 3a and the curve 3b (no stray field present), and the difference between the curve 4a and the curve 4b (stray field present) results in the same or nearly the same values. Therefore, differential field calculations may be used to extract useful information on the magnetic field produced by the magnet 10 even when the magnet 10 is small (e.g., 1 mm$^3$) and even when the magnetic field is measured in the presence of a stray field. That is, object position tracking systems according to some embodiments of the present technology may be substantially immune to stray magnetic fields, thus providing robust operation in a variety of applications.

FIG. 5 shows curves representing differential field calculations for the magnetic field measurements shown in FIG. 3B (or FIG. 4B). Curve 5a represents differential values obtained by determining a difference between the curve 3b and the curve 3a (or between the curve 4b and curve the 4a). Curve 5b represents differential values obtained by a difference between the curve 3d and the curve 3c (or between the curve 4d and the curve 4c).

The differential values of the curves 5a, 5b may be combined to form a single quantity representing the magnetic field of the magnetic 10. This quantity varies as a function of the magnet's position in the z-direction and therefore may be used to determine the magnet's position in the z-direction. In an embodiment of the present technology, the quantity representing the magnetic field of the magnet 10 is a field angle corresponding to an arctan of a differential x-component value (curve 5a) and a differential z-component value (curve 5b).

In FIG. 6, curve 6a is derived from field angle or arctan calculations of the curves 5a, 5b. An example of a beneficial aspect of the curve 6a is that, if it is known that the magnet 10 has moved in the z-direction but the position of the magnet 10 along the z-direction is not known because the magnet is not visible, and if the first and second sensors 1, 2 measure a magnetic field having a field angle of 130° for the magnet 10, the curve 6a may be used to determine that the magnet 10 is at a position corresponding to +10 mm in the z-direction.

More specifically, the magnetic field of the magnet 10 changes as the magnet 10 moves in the z-direction relative to the first and second sensors 1, 2. The changes in the magnetic field are reproducible and therefore can be used to establish a correlation between a position of the magnet 10 along a known path, and a quantity derived from the magnetic field of the magnet 10 (e.g., a field angle corresponding to an arctan of a differential value in a first dimension and a differential value in a second dimension orthogonal to the first dimension).

For example, for an installation in which a magnet may be used repeatedly to move along a known path to perform a particular function, yet the function cannot easily be observed, a mapping may be made of field angle as a function of distance along the path. When a specific field angle is determined for the magnet, based on measurements by sensors such as the first and second sensors 1, 2 discussed above, then the magnet's location along the path may be determined by determining a position that corresponds or maps to the specific field angle. The mapping may be via a look-up table of field angle data and corresponding position data stored in association with each other. Alternatively, the mapping may be via a mathematical model correlating the field angle data and the position data (e.g., a mathematical model of the curve 6a).

Figure 7:
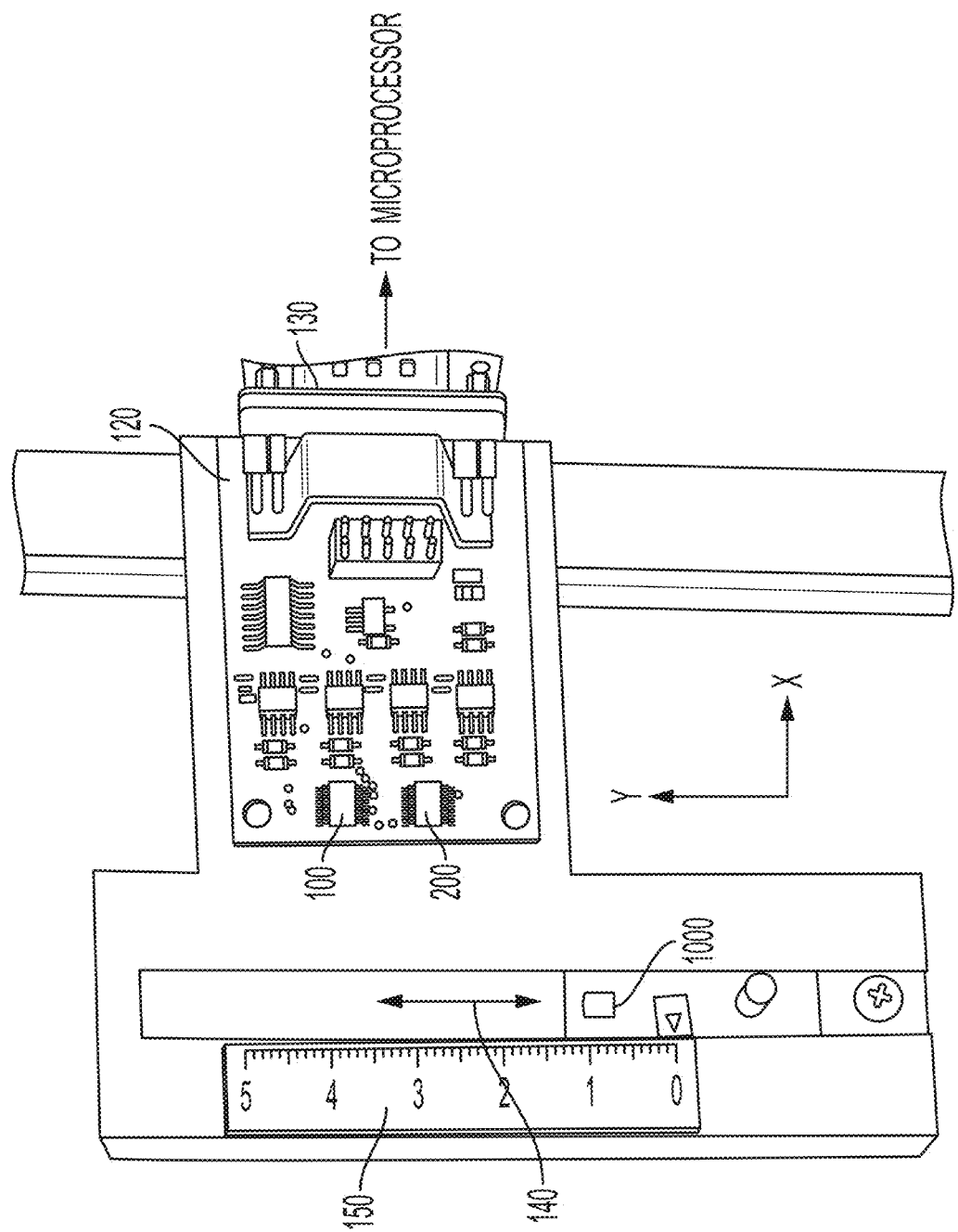
FIG. 7 shows a photograph of an object position detection system of the type shown in FIG. 4A.

FIG. 7 is an illustration showing an object position detection system of the type schematically shown in FIG. 4A (or FIG. 3A in the absence of a stray field). A first sensor 100 and a second sensor 200 are operatively attached to a circuit board 120 on which other circuitry is operatively attached. The circuit board 120 includes an interface 130 that is in communication with a processing circuitry (e.g., a microprocessor) (not shown). Signals from the first and second sensors 100, 200 are provided to the processing circuitry directly or via the other circuitry on the circuit board 120. The first and second sensors 100, 200 are arranged to sense or measure a magnetic field produced by a magnet 1000 that is slidably movable along a path 140 due to being fixed to a slidable component. Depending on the application, the slidable component could be a syringe, a plunger, an automobile brake component, or another component for which it is desirable to track position. The path 140 extends along the y-direction. A scale or ruler 150 used in a testing/calibration procedure is arranged near the magnet 1000 and extends parallel to the path 140.

In some embodiments of the present technology, the testing/calibration procedure may include:
- an act S10 of using the first and second sensors 100, 200 to measure a magnetic field of the magnet 1000 at a first known position along the path 140, to obtain field values in two dimensions (e.g., x and y) at the location of the first sensor 100 and at the location of the second sensor 200;
- an act S20 of performing a differential field calculation and an arctan calculation to obtain a first field angle from the four field values obtained in the act S10; and
- an act S30 of correlating the first field angle with the first known position.

The first known position may be quantified (i.e., given a value) according to a position of the magnet 1000 relative to the ruler 150. The acts S10, S20, S30 may then be repeated for other known positions along the path 140 to obtain a sufficient number of field angles to produce a representative curve showing how field angle varies as a function of position along the path 140, an example of which is the curve 6a. The field angle data and the corresponding position data may be stored in association with each other in a look-up table, as discussed above. Alternatively, the representative curve may be modelled mathematically so that a position can be calculated based on magnetic field data.

If the path 140 is long, multiple sets of the first and second sensors 100, 200 may be arranged to detect a position of the magnet 1000 along different segments of the path 140. For example, a first set of the first and second sensors 100, 200 may be arranged to measure an initial segment of the path 140, a second set of the first and second sensors 100, 200 may be arranged to measure a second segment of the path 140, a third set of the first and second sensors 100, 200 may be arranged to measure a third segment of the path 140, and so on. The sets of the first and second sensors 100, 200 may be arranged relative to each other such that, for example, as the magnet 1000 moves along the path 140 from the first segment to the second segment (i.e., away from the first set), the differential field obtained from the first set diminishes and the differential field obtained from the second set increases, and as the magnet moves from the second segment to the third segment (i.e., away from the second set towards the third set), the differential field obtained from the second set diminishes and the differential field obtained from the third set increases. With such an arrangement, end portions of adjacent segments overlap so that and there is no "dead zone" where the magnet 1000 cannot be reliably measured by any of the sets of the first and second sensors 100, 200.

As noted above, signals from the first and second sensors 100, 200 may be provided to the processing circuitry directly or via the other circuitry on the circuit board 120. The first sensor 100 may include x and y sensor elements 100x, 100y for measuring the x-component and the y-component of the magnetic field at the location of the first sensor 100. Similarly, the second sensor 200 may include x and y sensor elements 200x, 200y for measuring the x-component and the y-component of the magnetic field at the location of the second sensor 200.

Figure 8B:
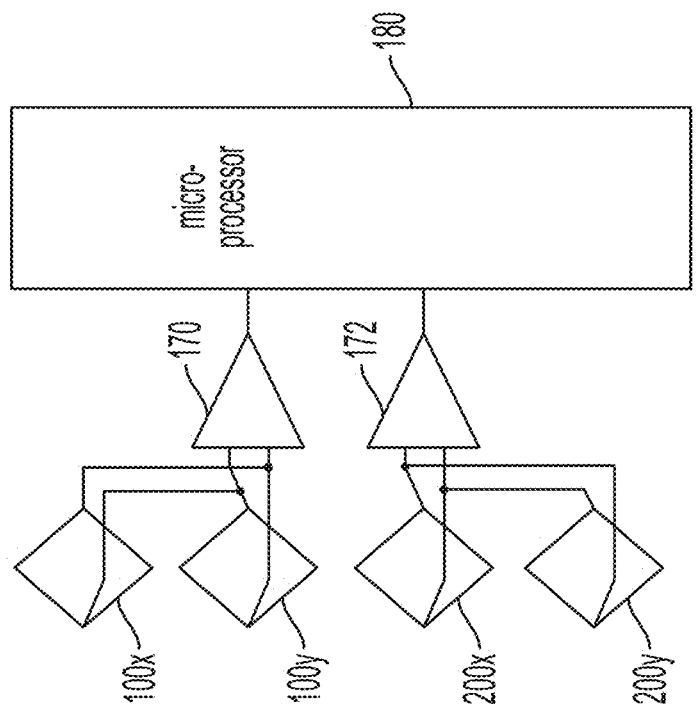
FIG. 8B shows circuitry connecting sensor elements to a microprocessor according to another embodiment of the present technology.
Figure 8A:
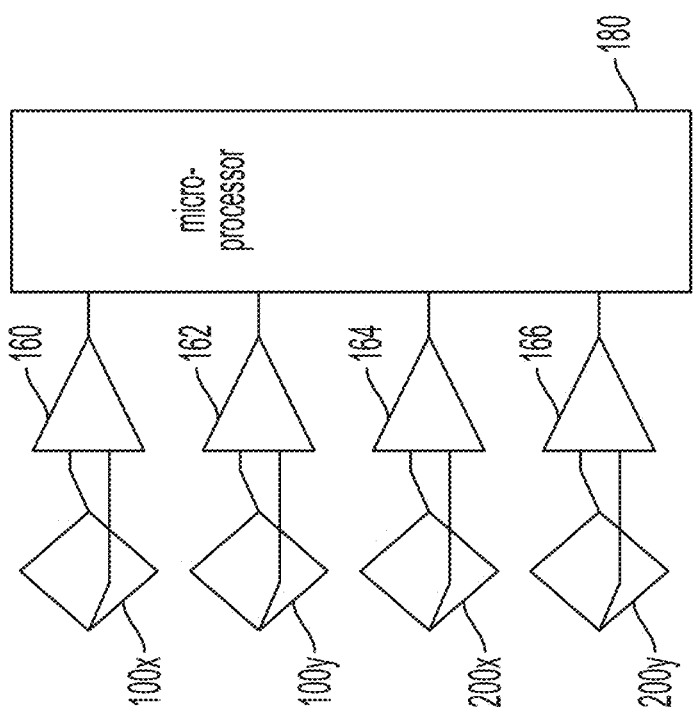
FIG. 8A schematically shows circuitry connecting sensor elements to a microprocessor according to an embodiment of the present technology.

Various electrical configurations of the sensor elements and processing circuitry of an object position determination system are possible. FIGS. 8A and 8B illustrate two non-limiting examples of circuitry that may be included on the circuit board 120. In FIG. 8A, the x and y sensor elements 100x, 100y, 200x, 200y may provide signals to respective amplifiers 160, 162, 164, 166, which in turn may provide four amplified signals to a microprocessor 180. The microprocessor 180 may be programmed to perform differential field and arctan calculations to determine a field angle. The microprocessor 180 may include circuitry to perform analog-to-digital conversion of the signals.

In FIG. 8B, the x and y sensor elements 100x, 100y, 200x, 200y may provide signals to first and second amplifiers 170, 172, such that the first amplifier 170 may receive x-component signals from the x sensor elements 100x, 200x, and the second amplifier 172 may receive y-component signals from the y sensor elements 100y, 200y. The first amplifier 170 may output to the microprocessor 180 a signal corresponding to a differential field calculation for the x dimension, and the second amplifier 172 may output to the microprocessor 180 a signal corresponding to a differential field calculation for the y dimension. The microprocessor 180, which may include circuitry to perform analog-to-digital conversion of the signals, may be programmed to perform an arctan calculation to determine a field angle from the two signals outputted by the first and second amplifiers 170, 172.

Figure 9B:
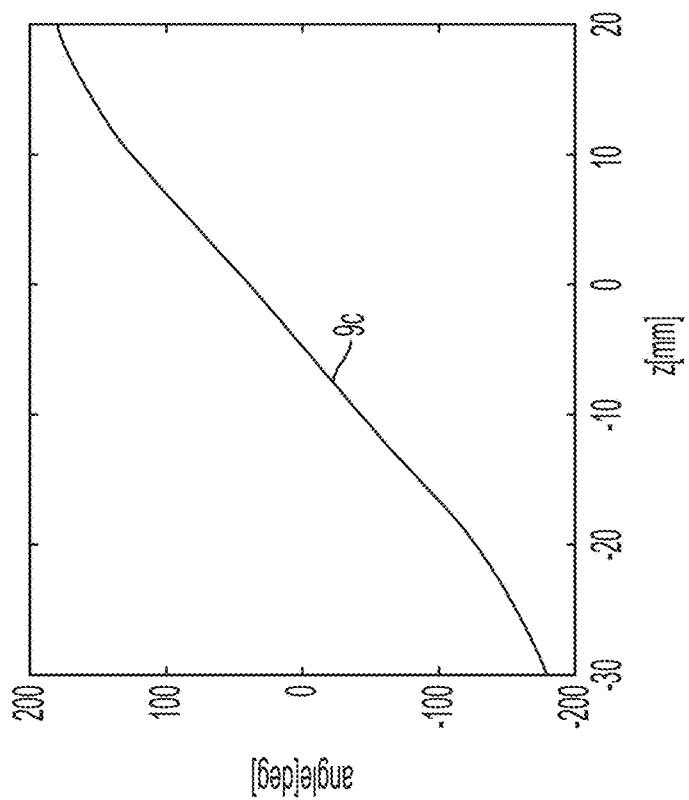
FIG. 9B shows field angle data obtained from the differential field data of FIG. 9A.
Figure 9A:
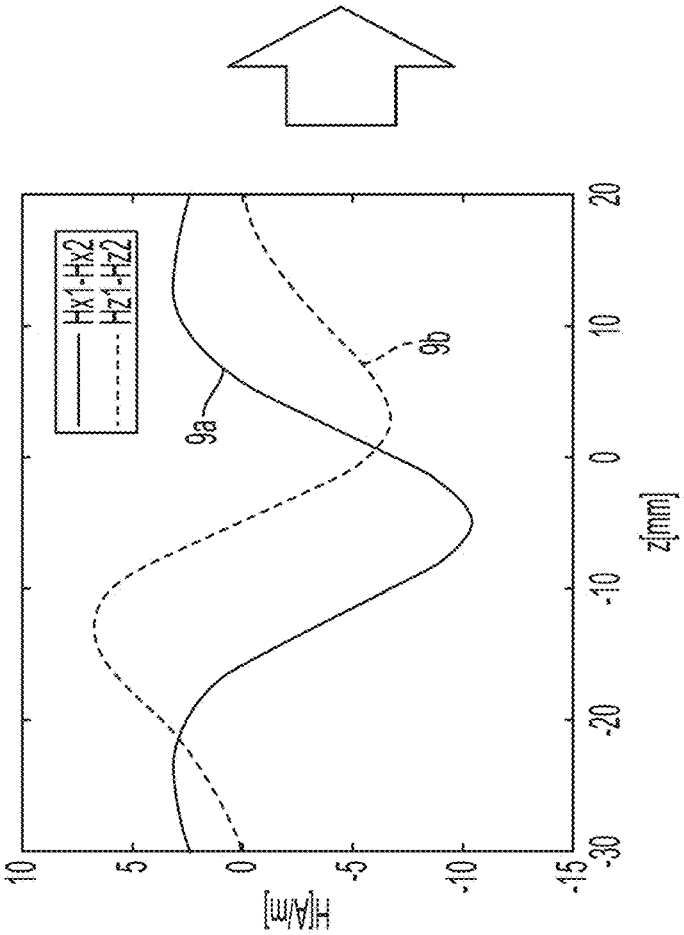
FIG. 9A shows differential field data.

In another embodiment, an arrangement of the type shown in FIG. 4A (or FIG. 3A in the absence of a stray field) was used to measure the magnetic field of the magnet 10 over a wider range of travel in the z-direction (5 cm instead of the 3 cm). The results of differential field calculations are shown in FIG. 9A, with curve 9a corresponding to the x dimension of the measured magnetic field and curve 9b corresponding to the z dimension of the measured magnetic field. The differential field values of the curves 9a, 9b were used in arctan calculations to yield the curve 9c in FIG. 9B.

In an embodiment where the range of travel of the magnet 10 may be large, such that the magnet's path of movement is long, multiple sets of first and second sensors 1, 2, may be used to track the magnet 10 in different segments of the path. For example, a first set of sensors may be used to track a magnet in a first segment of a long path, a second set of sensors may be used to track the magnet in a second segment of the long path, a third set of sensors may be used to track the magnet in a third segment of the long path, etc. In this example, the first and second segments (and/or the second and third segments) may be adjacent to each other or they may have portions that overlap.

In some of the previous embodiments, the magnet 10 had a size of 1 mm³. FIG. 10A shows results of differential field calculations performed using an arrangement of the type shown in FIG. 4A (or FIG. 3A in the absence of a stray field), but using a larger magnet having a volume of 8 mm³. Curve 10a corresponds to the x dimension of the measured magnetic field and curve 10b corresponds to the z dimension of the measured magnetic field. As shown in FIG. 10B, although the differential field values generally are larger, owing to the larger size of the magnet 10, the field angles are similar to those of the curve 6a for the same path of the magnet 10.

Similarly, FIG. 11A shows results for differential field calculations performed using an arrangement of the type shown in FIG. 4A (or FIG. 3A in the absence of a stray field), in which an even larger magnet having a volume of 27 mm$^3$ is used. Curve 11a corresponds to the x dimension of the measured magnetic field and curve 11b corresponds to the z dimension of the measured magnetic field. As shown in FIG. 11B, although the magnetic field values generally are larger than that of the a 1 mm$^3$ magnet and the 8 mm$^3$ magnet, the field angles are similar to those of the curve 6a for the same path of the magnet.

As will be readily appreciated from the discussions above, aspects of the present technology allow for determination of how field angles of a magnet vary as a function of distance along a path, from which a determination of the location of the magnet along the magnet's path may be made, even when the magnet is a small—thus producing a correspondingly small magnetic field—and is in the presence of a stray field.

The embodiments discussed herein relate to the measurement of a magnetic field in two dimensions. However, the present technology is not limited to two-dimensional measurements but may be extended to measurements in three dimensions, such as through use of 3D-AMR sensors (or other 3D magnetoresistive sensors), so that x, y, and z components of the magnetic field may be measured. Differential field calculations may be performed with, for example, two different pairs of the three dimensions (e.g., x-y and x-z, or x-y and y-z, or x-z and y-z) and thus yield two sets of field angles that can be used to locate a position of a magnet in two dimensions.

Some aspects of the present technology may be embodied as one or more methods. The acts performed as part of a method may be ordered in any suitable way. Accordingly, embodiments may be constructed in which acts are performed in an order different than illustrated, which may include performing some acts simultaneously, even though shown as sequential acts in illustrative embodiments.

The terms "direction" and "dimension" may be used interchangeably herein when referencing to characteristics related to any one or any combination of: the x-axis, the y-axis, and the z-axis.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. A magnet location determination system, comprising:
    first and second magnetic field sensors co-located at a first location;
    third and fourth magnetic field sensors co-located at a second location different from the first location; and
    a magnet configured to produce a magnetic field, the magnet being attachable to an object, wherein:
        the first magnetic field sensor is configured to detect a magnitude of the magnetic field in a first direction at the first location, and the second magnetic field sensor is configured to detect a magnitude of the magnetic field in a second direction at the first location, the second direction being orthogonal to the first direction, and
        the third magnetic field sensor is configured to detect a magnitude of the magnetic field in the first direction at the second location, and the fourth magnetic field sensor is configured to detect a magnitude of the magnetic field in the second direction at the second location; and
    a processor configured to receive signals from each of the first, second, third, and fourth magnetic field sensors and to provide an output indicating a location of the magnet along a travel path based on the received signals.

2. The system of claim 1, wherein the first, second, third, and fourth magnetic field sensors are configured to output signals during movement of the magnet.

3. The system of claim 1, further comprising processing circuitry coupled to the first, second, third, and fourth magnetic field sensors and configured to determine differential magnetic field values for the first and second directions based on the signals from the first, second, third, and fourth magnetic field sensors.

4. The system of claim 1, wherein the first, second, third, and fourth magnetic field sensors are coplanar.

5. The system of claim 1, wherein:
    at the first location, the first magnetic field sensor and the second magnetic field sensor are stacked along a first axis extending in a third direction orthogonal to the first direction and orthogonal to the second direction, and
    at the second location, the third magnetic field sensor and the fourth magnetic sensor are stacked along a second axis parallel to the first axis.

6. The system of claim 1, wherein each of the first, second, third, and fourth magnetic field sensors is one of:
    a magnetoresistive sensor,
    a Hall-effect sensor, or
    a fluxgate sensor.

7. A system for determining a location of a magnet, the system comprising:
    a first sensor arranged to measure at least two magnitudes of a magnetic field produced by a magnet during a movement of the magnet along a travel path that extends from a first location to a second location different from the first location, the first sensor being located at a first sensor position;
    a second sensor arranged to measure at least two magnitudes of the magnetic field produced by the magnet during the movement of the magnet along the travel path, the second sensor being located at a second sensor position different from the first sensor position; and
    a microprocessor operatively connected to the first and second sensors to receive signals derived from signals outputted by the first and second sensors during the movement of the magnet along the travel path, wherein the microprocessor is programmed to:
        calculate a field angle from a first differential field in a first field direction and a second differential field in a second field direction orthogonal to the first direction, the first and second differential fields being obtained based on the signals outputted by the first and second sensors, and output a location of the magnet along the travel path based on the field angle calculated from the first and second differential fields.

8. The system of claim 7,
wherein each of the first and second sensors includes:
a first sensing element arranged to sense a magnitude of the magnetic field in the first field direction, and
a second sensing element arranged to sense a magnitude of the magnetic field in the second field direction, and
wherein the microprocessor is programmed to perform a differential-field routine to:
receive a first signal derived from an output of the first sensing element of the first sensor, the first signal indicating a value of the magnetic field in the first field direction at the first sensor position,
receive a second signal derived from an output of the first sensing element of the second sensor, the second signal indicating a value of the magnetic field in the first field direction at the second sensor position,
receive a third signal derived from an output of the second sensing element of the first sensor, the third signal indicating a value of the magnetic field in the second field direction at the first sensor position, and
receive a fourth signal derived from an output of the second sensing element of the second sensor, the fourth signal indicating a value of the magnetic field in the second field direction at the second sensor position.

9. The system of claim 8, wherein the microprocessor is programmed to perform the differential-field routine to:
calculate the first differential field in the first field direction by calculating a difference between the first signal and the second signal,
calculate the second differential field in the second field direction by calculating a difference between the third signal and the fourth signal, and
calculate the field angle by calculating an arctan of the first differential field and the second differential field.

10. The system of claim 8, wherein:
the first sensing element of the first sensor and the first sensing element of the second sensor are coplanar, and
the second sensing element of the first sensor and the second sensing element of the second sensor are coplanar.

11. The system of claim 8, wherein:
at the first sensor position, the first and second sensing elements of the first sensor are stacked along a first axis extending in a direction orthogonal to the first field direction and orthogonal to the second field direction, and
at the second sensor position, the first and second sensing elements of the second sensor are stacked along a second axis parallel to the first axis.

12. The system of claim 8, wherein the first and second sensing elements of the first sensor are located on a single first die, and the first and second sensing elements of the second sensor are located on a single second die.

13. The system of claim 7, wherein each of the first and second sensors includes one of:
a magnetoresistive sensor,
a Hall-effect sensor, or
a fluxgate sensor.

14. The system of claim 7, wherein the travel path of the magnet is a predetermined travel path.

15. The system of claim 7, wherein the first sensor and the second sensor are coplanar.

16. The system of claim 7, wherein the magnet is attached to a movable structure, and the first and second sensors are at fixed positions.

17. The system of claim 7, wherein the magnetic field measured by the first and second sensors is in a range of −10 A/m to about +10 A/m.

18. The system of claim 7, wherein the magnetic field measured by the first and second sensors is in a range of −10 kA/m to about +10 kA/m.

19. A method for determining a location of a magnet, the method comprising:
providing a sensor system that includes:
a first sensor arranged to measure at least two magnitudes of a magnetic field produced by a magnet during a movement of the magnet along a travel path that extends from a first location to a second location different from the first location, the first sensor being located at a first sensor position, and
a second sensor arranged to measure at least two magnitudes of the magnetic field produced by the magnet during the movement of the magnet along the travel path, the second sensor being located at a second sensor position different from the first sensor position; and
using a microprocessor operatively connected to the first and second sensors to:
receive signals derived from signals outputted by the first and second sensors during the movement of the magnet along the travel path,
calculate a field angle from a first differential field in a first field direction and a second differential field in a second field direction orthogonal to the first dimension, the first and second differential fields being obtained based on the signals outputted by the first and second sensors, and
output a location of the magnet along the travel path based on the field angle calculated from the first and second differential fields.

20. The method of claim 19,
wherein the received signals include:
a first signal indicating a value of the magnetic field in the first field direction at the first sensor position,
a second signal indicating a value of the magnetic field in the first field direction at the second sensor position,
a third signal indicating a value of the magnetic field in the second field direction at the first sensor position, and
a fourth signal indicating a value of the magnetic field in the second field direction at the second sensor position, and
wherein the using of the microprocessor uses the microprocessor to:
calculate the first differential field in the first field direction by calculating a difference between the first signal and the second signal,
calculate the second differential field in the second field direction by calculating a difference between the third signal and the fourth signal, and
calculate the field angle by calculating an arctan of the first differential field and the second differential field.

* * * * *